(12) United States Patent
Ryu et al.

(10) Patent No.: US 10,553,273 B2
(45) Date of Patent: Feb. 4, 2020

(54) SEMICONDUCTOR MEMORY DEVICE AND DATA PATH CONFIGURATION METHOD THEREOF

(71) Applicant: Samsung Electronics Co., Ltd., Suwon-si (KR)

(72) Inventors: Jang-Woo Ryu, Seoul (KR); Kyungryun Kim, Seoul (KR); Soo Hwan Kim, Yongin-si (KR); Huikap Yang, Hwasung-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/032,822

(22) Filed: Jul. 11, 2018

(65) Prior Publication Data

US 2019/0139594 A1  May 9, 2019

(30) Foreign Application Priority Data

Nov. 7, 2017 (KR) .......................... 10-2017-0147524

(51) Int. Cl.

| *G11C 7/00* | (2006.01) |
|---|---|
| *G11C 11/4091* | (2006.01) |
| *G11C 7/06* | (2006.01) |
| *G11C 7/18* | (2006.01) |
| *G11C 8/08* | (2006.01) |
| *G11C 11/4097* | (2006.01) |
| *G11C 11/4093* | (2006.01) |

(52) U.S. Cl.
CPC ............ *G11C 11/4091* (2013.01); *G11C 7/06* (2013.01); *G11C 7/18* (2013.01); *G11C 8/08* (2013.01); *G11C 11/4097* (2013.01); *G11C 11/4093* (2013.01)

(58) Field of Classification Search
CPC ....... G11C 11/4091; G11C 5/025; G11C 7/06; G11C 7/065; G11C 7/1042; G11C 7/1048; G11C 7/18
See application file for complete search history.

(56) References Cited

U.S. PATENT DOCUMENTS

| 6,452,824 | B1 | 9/2002 | Okamura |
|---|---|---|---|
| 7,002,858 | B2 | 2/2006 | Lee |
| 7,423,896 | B2 | 9/2008 | Lee |
| 7,808,825 | B2 | 10/2010 | Park |

(Continued)

OTHER PUBLICATIONS

Examination report dated Jul. 22, 2019 from the Singapore Patent Office in corresponding Singapore Patent Application.

*Primary Examiner* — Pho M Luu
(74) *Attorney, Agent, or Firm* — Muir Patent Law, PLLC

(57) ABSTRACT

A semiconductor memory device includes a cell array that includes a first row block and a second row block, a bit line sense amplifier block that senses data stored in the first row block or the second row block, a local sense amplifier that latches the sensed data transferred from the bit line sense amplifier block, and a switch that connects the local sense amplifier with a selected one of a first global data line and a second global data line in response to a select signal. The second row block may be placed at an edge of the cell array, and the switch connects the local sense amplifier with the first global data line when the first row block is activated and connects the local sense amplifier with the second global data line when the second row block is activated.

20 Claims, 10 Drawing Sheets

(56) References Cited

U.S. PATENT DOCUMENTS

| | | | |
|---|---|---|---|
| 8,081,530 B2 * | 12/2011 | Chou | G11C 7/065 |
| | | | 365/203 |
| 8,411,512 B2 | 4/2013 | Kim et al. | |
| 8,675,421 B2 | 3/2014 | Cho | |
| 8,743,639 B2 * | 6/2014 | Jang | G11C 7/08 |
| | | | 365/203 |
| 9,019,789 B2 * | 4/2015 | Kim | G11C 7/08 |
| | | | 365/185.21 |
| 9,324,400 B2 | 4/2016 | Ku | |
| 9,575,880 B2 | 2/2017 | Cho | |
| 9,595,315 B2 * | 3/2017 | Han | G11C 11/4091 |
| 9,666,254 B1 | 5/2017 | Woo | |
| 2006/0013051 A1 | 1/2006 | Lee | |
| 2007/0025173 A1 | 2/2007 | Cullum et al. | |
| 2007/0280020 A1 | 12/2007 | Lee et al. | |
| 2010/0128545 A1 | 5/2010 | Lee et al. | |
| 2012/0127816 A1 | 5/2012 | Kajigaya et al. | |
| 2016/0064044 A1 | 3/2016 | Stansfield | |
| 2016/0284390 A1 | 9/2016 | Tomishima et al. | |
| 2017/0177526 A1 | 6/2017 | Wu et al. | |

* cited by examiner

SEMICONDUCTOR MEMORY DEVICE AND DATA PATH CONFIGURATION METHOD THEREOF

CROSS-REFERENCE TO RELATED APPLICATIONS

This application claims priority under 35 U.S.C. § 119 to Korean Patent Application No. 10-2017-0147524 filed Nov. 7, 2017, in the Korean Intellectual Property Office, the disclosures of which is herein incorporated by reference in its entirety.

BACKGROUND

Embodiments of the inventive concept described herein relate to a semiconductor memory device, and more particularly, relate to a semiconductor memory device capable of writing or reading data with a data path configuration and a related method thereof.

The capacity and speed of a semiconductor memory device used in various electronic systems is increasing depending on a demand on high performance of users. For example, dynamic random access memory (DRAM) (a type of volatile memory) stores data in the form of charges that are charged in a cell capacitor.

A cell array of the DRAM may use a row block (or a sub-array) in which memory cells are arranged in rows and columns, as a basic unit. A plurality of bit line sense amplifiers BLSAs connected to corresponding bit lines are interposed between row blocks. Data output from a bit line sense amplifier of a selected column are input to a local sense amplifier LSA through a local data line. The local sense amplifier LSA typically transfers the input data to an even global data line GIOe or an odd global data line GIOo.

However, in a cell array having a bit line sense amplifier of an open bit line structure, there is a limit on the following: the number of row blocks is an odd number. When row blocks placed at an edge of the cell array among row blocks are selected at the same time where and an even number of row blocks exists, data output from these edge row blocks would be transferred to the same global data line (e.g., an even global data line). Thus, if a read operation would be performed on row blocks placed at an edge(s) of a cell array including even-numbered row blocks, data collision occurs at the global data line.

In the case where the even number of row blocks is provided depending on various requirements, the data collision acts as a large limitation on improvement of performance.

SUMMARY

According to an exemplary embodiment, a semiconductor memory device includes a cell array that includes a first row block and a second row block, a bit line sense amplifier block that senses data stored in the first row block or the second row block, a local sense amplifier that latches the sensed data transferred from the bit line sense amplifier block, and a switch that connects the local sense amplifier with any one of a first global data line and a second global data line in response to a select signal. The second row block may be located at an edge of the cell array, and the switch connects the local sense amplifier with the first global data line when the first row block is activated and connects the local sense amplifier with the second global data line when the second row block is activated.

According to an exemplary embodiment, a semiconductor memory device which includes a first global data line and a second global data line includes a first edge row block located at one end of a cell array, a second edge row block located at an opposite end of the cell array, a third row block that is interposed between the first edge row block and the second edge row block, a first local sense amplifier that outputs first data sensed from the first edge row block to the first global data line, a second local sense amplifier that outputs second data sensed from the second edge row block to an edge global data line, a third local sense amplifier that outputs third data sensed from the third row block to the second global data line, and a multiplexer that selectively connects two of the first global data line, the second global data line, and the edge global data line with an input/output sense amplifier in response to a select signal.

According to an exemplary embodiment, a data path configuration method of a semiconductor memory device includes receiving an address for selecting at least one of a plurality of row blocks included in a cell array, determining whether the address corresponds to an edge row block among the plurality of row blocks of the cell array, and connecting a local sense amplifier corresponding to the selected at least one row block to an even global data line or an odd global data line depending to the determination result.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Figure 1:
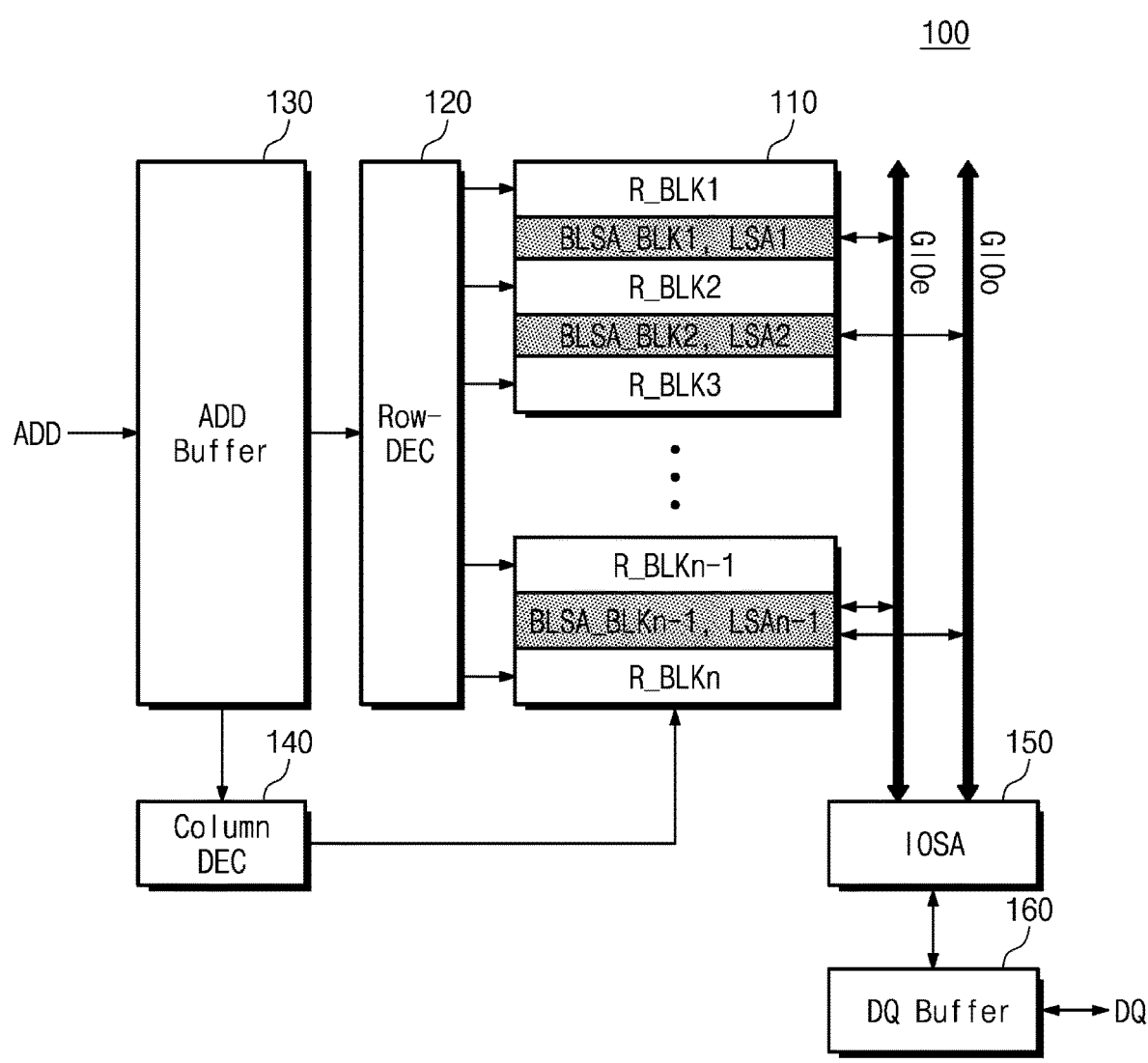
FIG. 1 is a block diagram illustrating a configuration of a dynamic random access memory device according to an embodiment of the inventive concept.

It should be understood that both the foregoing general description and the following detailed description are provided as examples, and it should be regarded as an additional description of the claimed invention is provided. Reference numerals will be represented in detail in embodiments of the inventive concept, examples of which are illustrated in the accompanying drawings. Wherever possible, the same reference numerals are used in the drawings and the description to refer to the same or similar parts.

Below, a synchronous DRAM (SDRAM) is used as an example of a semiconductor device to describe features and functions of the inventive concept. However, one skilled in the art may easily understand other merits and performance of the inventive concept disclosed herein with different memories, including other types of volatile and nonvolatile memories.

FIG. 1 is a block diagram illustrating a configuration of a dynamic random access memory (DRAM) device according to an embodiment of the inventive concept. Referring to FIG. 1, a DRAM device 100 may include a cell array 110, a row decoder 120, an address buffer 130, a column decoder 140, an input/output sense amplifier 150, and a data buffer 160.

The cell array 110 includes a plurality of memory cells that are connected with word lines and bit lines and are arranged in a row direction and a column direction. Each of the memory cells may include a cell capacitor and an access transistor. In each memory cell, a gate of the access transistor is connected to a corresponding one of the word lines arranged in the row direction. A first end of the access transistor is connected to a bit line extending in the column direction. A second end of the access transistor may be connected to the cell capacitor. Activating a word line causes the access transistor of a row of memory cells connected to the activated word line to turn on, thus connecting the cell capacitors of this row of memory cells to be connected to a corresponding bit line.

The cell array 110 may include a plurality of row blocks R_BLK1 to R_BLKn (n being a natural number). Each row block R_BLK1 to R_BLKn may comprise a plurality of word lines each connected to be selectively activated by row decoder 120. In each row block, a plurality of rows of memory cells are formed, with each row of memory cells being connected to a corresponding word line. Bit lines may extend across the word lines in a row block, each bit line connected to memory cells (e.g., to the cell capacitors of the memory cells when the access transistor at the intersection of the bit line and the word lines the bit line crosses. Blocks (or groups) of bit line sense amplifiers BLSA (BLSA_BLK1, BLSA_BLK2, . . . BLSA_BLKn−1) for sensing bit lines are disposed between the plurality of row blocks R_BLK1 to R_BLKn. Local sense amplifiers LSA1 to LSAn−1 are each disposed to latch data output from a corresponding one of the bit line sense amplifier blocks BLSA_BLK1, BLSA_BLK2, BLSA_BLKn−1 and provide the latched data to global data lines GIOe and GIOo. The bit line sense amplifiers BLSA may have an open bit line structure such that each bit line sense amplifier BLSA is connected to bit lines formed on either side of the bit line sense amplifier blocks BLSA_BLK1, BLSA_BLK2, . . . BLSA_BLKn−1 (i.e., connected to bit lines provided in different row blocks).

In particular, if a word line of a row block (e.g., R_BLKn) at an edge of the cell array 110 is activated, the local sense amplifier LSAn−1 may output latched data to any one of the global data line sets GIOe and GIOo. For ease of explanation, each of global data line sets GIOe and GIOo may be referred to in the singular herein as global data lines, however, it will be appreciated that each of the global data line sets GIOe and GIOo may comprise a plurality of data lines. In a semiconductor memory structure including a bit line sense amplifier BLSA of an open bit line structure, edge row blocks R_BLK1 and R_BLKn may be selected at the same time. In this case, the local sense amplifier LSA1 outputs data of the edge row block R_BLK1 at one side of the cell array 110 to the even global data line GIOe. In contrast, the local sense amplifier LSAn−1 outputs data of the edge row block R_BLKn at an opposite side of the cell array 110 to the odd global data line GIOo. Of course, the opposite is possible.

In detail, in the open bit line structure, adjacent local sense amplifiers (e.g., LSA1 and LSA2) are respectively connected to different global data lines GIOe and GIOo. In the open bit line structure, assuming that the number of row blocks R_BLK1 to R_BLKn are an odd number (i.e., n=2m+1) (m being a natural number), even though the edge row blocks R_BLK1 and R_BLKn are simultaneously selected, the local sense amplifiers LSA1 and LSAn−1 may output data to different global data lines GIOe and GIOo. Further, even when the number of row blocks R_BLK1 to R_BLKn is an even number (i.e., n=2m) (m being a natural number), even when the edge row blocks R_BLK1 and R_BLKn are simultaneously selected, the local sense amplifiers LSA1 and LSAn−1 may output data to the different global data lines GIOe and GIOo. A structure that enables the above-described operation will be described with reference to accompanying drawings later.

The row decoder 120 selects a word line of a row of memory cells to be accessed, in response to an input address ADD, and more particularly, the row address portion of the input address ADD. The row decoder 120 decodes the row address and enables a word line (also referred to as activating a word line) corresponding to the decoded address. Also, in a self-refresh mode (as well as an auto-refresh mode) of operation, the row decoder 120 may decode a row address generated from an address counter (not illustrated) and may enable a word line corresponding to the decoded address. The column decoder 140 decodes the column address portion of the input address ADD to select a corresponding set of bit line sense amplifiers BLSA to read or write data to or from a corresponding set of memory cells to which the selected set of bit line sense amplifiers BLSA are connected and to which the activated word line is connected. Each bit line sense amplifier may be a latch to sense and latch data read from a corresponding memory cell (connected to the bit line sense amplifier via a corresponding bit line) and to latch data provided from a corresponding local sense amplifier LSA to write the data to a corresponding memory cell.

The address buffer 130 temporarily stores the address ADD input from the outside. The address buffer 130 provides the stored address to the row decoder 120 (the row address) and the column decoder 140 (the column address). The address ADD received externally may have its format changed by the address buffer 130 (and may cause internal generation of additional addresses ADD corresponding to other accesses associated with an externally received command).

The input/output sense amplifier 150 provides write data to the cell array 110 through the global data lines GIOe and GIOo. Further, the input/output sense amplifier 150 may amplify data read from the cell array 110 that is provided through the global data lines GIOe or GIOo and may output the amplified data to the data buffer 160.

The data buffer 160 stores data DQ input from the outside or to be output to the outside. The input data stored in the data buffer 160 may be provided to the cell array 110 through the input/output sense amplifier 150. In addition, the data buffer 160 may output data read from the cell array 110 to the outside of the DRAM device 100 (e.g., via terminals, such as chip pads, of the DRAM device). It may be well understood that the data buffer 160 further includes driver circuits for exchanging the data DQ with the outside. The DRAM device 100 may be a semiconductor chip and/or may be an integrated circuit formed within a semiconductor chip (e.g., a portion of a System on Chip (SoC)).

A row block of the DRAM device 100 according to an embodiment of the inventive concept may be added without limitation on the number of row blocks upon designing or manufacturing the DRAM device 100. Accordingly, the number of row blocks may be freely selected upon designing the cell array 110.

Figure 2:
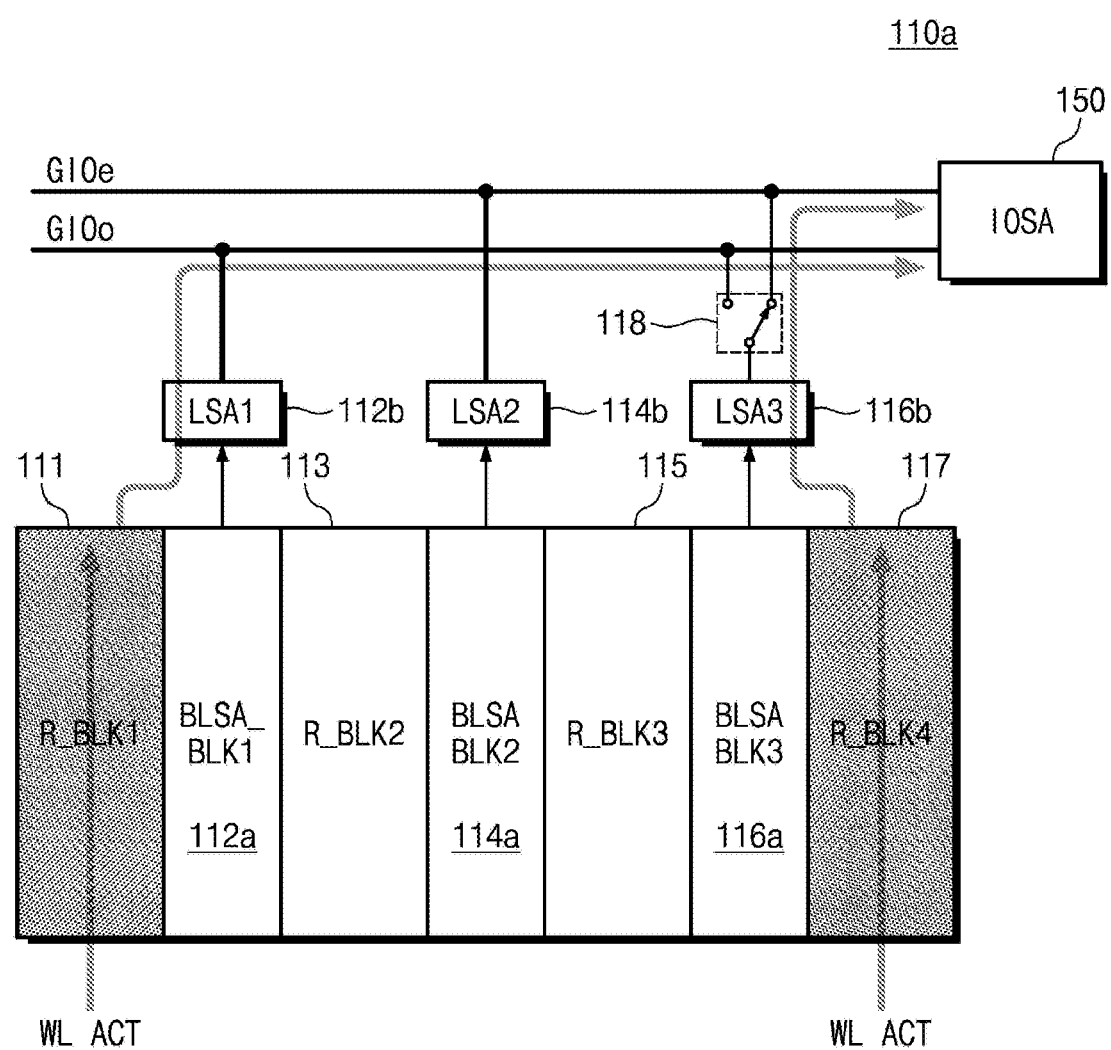
FIG. 2 is a block diagram illustrating a configuration of a data path according to an embodiment of the inventive concept.

FIG. 2 is a block diagram illustrating a configuration of a data path according to an embodiment of the inventive concept. Referring to FIG. 2, a cell array 110a includes a switch 118 that selectively connects a local sense amplifier 116b to either one of the even global data line GIOe and the odd global data line GIOo. If a row block 117 placed at one edge is selected, the local sense amplifier 116b may be connected through the switch 118 to the even global data line GIOe, and may not connect to the odd global data line GIOo that is generally connected to the local sense amplifier 116b. When the global data lines GIOe and GIOo comprise a set of data lines, switch 118 may comprise a plurality of switches to selectively connect a plurality of local data lines LIO to the global data line set (i.e., the selected set of GIOe or GIOo) simultaneously. As will be appreciated, in this configuration, both local sense amplifier LSA3 and immediately neighboring local sense amplifier LS2 are connected to the same global data line (here even global data line GIOe in this configuration). Here, the terms "even global data line" and "odd global data line" are used as labels to distinguish one set from the other (as is conventional), however, the connection relationship of these global data lines can be reversed from that shown in the figures.

Assume that a row block 115 not placed at an edge of the cell array 110a includes a word line that is selected (e.g., activated) by the row decoder 120 (e.g., a voltage of the selected word line is increased to a level to turn on access transistors of the memory cells connected to the selected word line). Herein, reference to selecting a row block may refer to selecting a word line of the selected row block (e.g., by decoding a row address corresponding to a word line of the selected row address that is then activated). Each of the bit line sense amplifiers 114a of bit line sense amplifier block BLSA_BLK2 are connected to a corresponding bit line pair (e.g., extending across row block 115 in the horizontal direction). Typically, although both bit lines of a bit line pair may be used in access operations for different memory cells, for any single access operation, one of the bit lines is used to access data of a memory cell (in cooperation with a corresponding bit line sense amplifier) and the other of bit line of bit line pair is used to provide a reference voltage (to which the corresponding bit line sense amplifier compares the voltage of the accessing bit line), respectively referred to as bit line "BL" and complementary bit line "BLB" herein. Some of the bit lines BL formed in the row block 115 are connected to a corresponding one of bit line sense amplifiers 114a and some are connected to a corresponding one of bit line sense amplifiers 116a. When performing such an access of a row of memory cells in row block 115, bit lines in row block R_BLK2 and row block R_BLK4 may be used as complementary bit lines BLB. Data of the row block 115, which are sensed by the bit line sense amplifiers 114a and the bit line sense amplifiers 116a, are provided to a local sense amplifier 114b and the local sense amplifier 116b. The local sense amplifier 114b may output data to the even global data line GIOe, and the local sense amplifier 116b may output data to the odd global data line GIOo. In this case, the switch 118 may be controlled such that the local sense amplifier 116b and the odd global data line GIOo are electrically connected. As used herein, components described as being "electrically connected" are configured such that an electrical signal can be transferred from one component to the other (such electrical signal may be selectively transferred and may be attenuated in strength as it transferred).

Edge row blocks 111 and 117 placed at edges of the cell array 110a may also be selected by the row decoder 120. In this case, word lines of the edge row blocks 111 and 117 may be activated. When a word line of edge row block 111 is activated, bit lines BL of the row block 111 are connected to corresponding bit line sense amplifiers 112a to provide access to memory cells connected to the activated word line. Bit lines of row block R_BLK2 may be used as complementary bit lines BLB in this instance. When a word line of edge row block 117 is activated, bit lines BL of row block R_BLK4 are connected to corresponding bit line sense amplifiers 116a to provide access to memory cells connected to the activated word line. Bit lines of row block R_BLK3 may be used as complementary bit lines BLB in this instance. Such access, as well as other accesses of memory cells described herein, may be a data read access (i.e., reading data from memory cells) or a data write access (i.e., writing data to memory cells).

When data stored in the selected edge row block 111 are sensed by the bit line sense amplifiers 112a, the sensed data are provided to a local sense amplifier 112b through one or more local data lines LIO. The local sense amplifier 112b may latch the data sensed by the bit line sense amplifiers 112a and output the data to the odd global data line GIOo. The data output from the local sense amplifier 112b may be provided to the input/output sense amplifier 150 through the odd global data line GIOo. In addition, data stored in the selected edge row block 117 are sensed by the bit line sense amplifier 116a, and the sensed data are provided to the local sense amplifier 116b through a local data line LIO. In some examples, a certain set of row addresses may each identify a pair of word lines, each pair having one word line within edge row block 111 and one word line within edge row block 117. When a row address within such set is decoded by the row decoder 120, row decoder 120 simultaneously activates a word line in edge row block 111 and a word line in edge row block 117, where data from a corresponding memory cell row in edge row block 111 is sensed and latched by bit line sense amplifiers 112a of bit line sense amplifier block BLSA_BLK1 and data from a corresponding memory cell row in edge row block 117 is sensed and latched by bit line sense amplifiers 116a of bit line sense amplifier block BLSA_BLK3. In some examples, the memory capacity size (e.g., number of memory cells) of edge row blocks 111 and 117 may be half that of inner row blocks (e.g., 113 and 115 in FIG. 2). Here, if the data output from both the local sense amplifiers 112b and 116b are provided to the odd global data line GIOo, collision with the data output from the local sense amplifier 112b may occur. Accordingly, the switch 118 may be controlled such that data sensed from the edge row block 117 are provided to the even global data line GIOe.

The switch 118 connects the local sense amplifier 116b with the even global data line GIOe when edge row block 117 is selected (e.g., when the edge row blocks 111 and 117 are simultaneously selected). In contrast, the switch 118 connects the local sense amplifier 116b with the odd global data line GIOo upon selecting the remaining inner row blocks other than the edge row block 117. Switch 118 may be controlled by row decoder 120. For example, row decoder 120 may partially decode a received row address to identify edge row block R_BLK4 117, the result of such decoding being provided as a control input to switch 118. In some examples, switch 118 may be embodied as a demultiplexer/multiplexer, (acting as a demultiplexer in a read operation and a multiplexer in a write operation) with a control input being provided by row decoder 120 that is responsive to the row address input to the row decoder 120. Even though the even number of row blocks are formed, data collision on the global data line GIO may be prevented by the switch 118.

Figure 3:
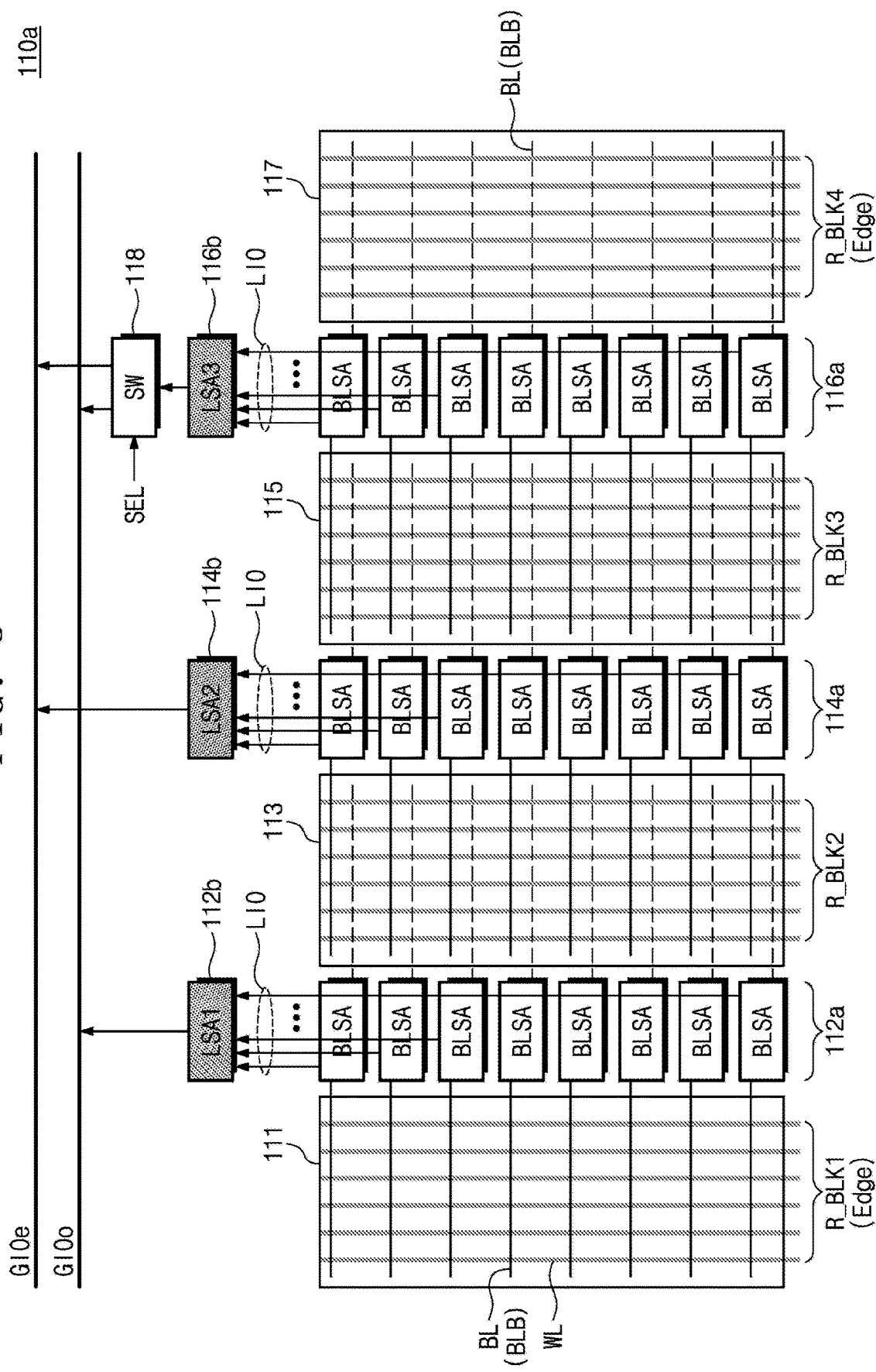
FIG. 3 is a block diagram illustrating a detailed structure of a cell array of FIG. 2.

FIG. 3 is a block diagram illustrating an exemplary detailed structure of a cell array of FIG. 2. Referring to FIG. 3, the cell array 110a of the inventive concept includes the switch 118 that selectively connects the local sense amplifier 116b with either the global data line sets GIOe and GIOo in response to a select signal SEL.

Each of row blocks 111, 113, 115, and 117 may include a plurality of memory cells at intersections of a plurality of word lines WL and a plurality of bit line BL and BLB. Four row blocks 111, 113, 115, and 117 are illustrated to describe the case where the even number of row blocks are provided. However, the inventive concept may not be limited thereto. That is, there may be provided row blocks 111, 113, 115, and 117, the number of which is an even number of 2 or more. In some embodiments, the number of row blocks may be odd.

The row blocks 111, 113, 115, and 117 may include at least two edge row blocks placed at edges of the cell array 110a. The edge row blocks 111 and 117 are each placed at an edge area of the cell array 110a and the bit line sense amplifiers BLSA are not disposed at one side of each of the edge row blocks 111 and 117 (e.g., not disposed at the side of the edge row blocks 111 and 117 corresponding to the edge of the cell array 110a). Cell array 110a may be the cell array of one bank of DRAM 100, where DRAM 100 includes multiple banks that may be independently and simultaneously accessed.

The bit line sense amplifiers BLSA may not be disposed on a left side of the edge row block 111. Bit lines BL (which may act as complementary bit lines BLB at times) are formed in the edge row block 111. As noted herein, the terms "bit line" BL and "complementary bit line" BLB are used as only relative names in terms of the sensing operation of the bit line sense amplifier BLSA to which these bit lines connect, and their role as bit line "BL" (e.g., to provide charge of a memory cell) and as complementary bit line BLB (e.g., to provide a comparing voltage to the bit line sense amplifier) may change in dependence of which memory cells are to be read (e.g., in dependence of what row block the memory cells to be read are part of). This dual role of each bit line is represented in FIG. 3 with the labels "BL (BLB)" although reference to such bit lines herein may not include use of the parenthetical and may refer to just "BL" or "BLB" in dependence of their role. As illustrated in FIG. 3, the bit lines BL (BLB) of edge row block 111 are respectively connected to the bit line sense amplifiers 112a. Although not illustrated in FIG. 3, dummy bit lines may be interposed between bit lines BL (BLB) of edge row block 111 that are not electrically connected to memory cells and may be electrically floating (e.g., no electrical connection to other circuitry of DRAM 100). Also, the bit line sense amplifiers BLSA may not be disposed on a right side of the edge row block 117. Bit lines BL (BLB) are formed in the edge row block 117. As illustrated in FIG. 3, the bit lines BL (BLB) are respectively connected to the bit line sense amplifiers 116a. Although not illustrated in FIG. 3, dummy bit lines may be interposed between bit lines BL (BLB) of edge row block 117 that are not electrically connected to memory cells and may be electrically floating (e.g., no electrical connection to other circuitry of DRAM 100).

The bit line sense amplifiers 112a may sense data stored in memory cells of the row blocks 111 and 113 or may write data therein. The bit line sense amplifiers 112a may sense data stored in the row block 111 by using the bit lines BL in row block 111 and (in a separate access operation) may sense data stored in the row block 113 by using some of the bit lines BL (dashed lines) in row block 113). Data sensed and latched by the bit line sense amplifiers 112a are selected to be output to local sense amplifier LSA1 112b by a column select signal CSL. The column select signal CSL may be output by column decoder 140 as a result of decoding a column address. The data latched by the selected bit line sense amplifiers 112a are provided to the local sense amplifier 112b through local data lines LIO. Data latched by the local sense amplifier 112b may be provided to the odd global data line GIOo (e.g., GIO1, GIO3, GIO5, etc.).

Bit line sense amplifiers 114a may sense data stored in memory cells of the row blocks 113 and 115. The bit line sense amplifiers 114a may sense data stored in the row block 113 by using some of the bit lines BL in row block 113 (solid lines) and may sense data stored in the row block 115 by using some of the bit lines BL in row block 115 (dashed lines). The data latched by the bit line sense amplifiers 114a are provided to the local sense amplifier 114b through local data lines LIO. Data latched by the local sense amplifier 114b may be provided to the even global data line GIOe (e.g., GIO0, GIO2, GIO4, etc.).

Bit line sense amplifiers 116a may sense data stored in memory cells of the row blocks 115 and 117. The bit line sense amplifiers 116a may sense data stored in the row block 115 by using some of the bit lines BL of row block 115 (solid lines) and may sense data stored in the row block 117 by using the bit lines BL in row block 117. The data latched by the bit line sense amplifiers 116a are provided to the local sense amplifier 116b through local data lines LIO. Data latched by the local sense amplifier 116b may be output to the even global data line GIOe or the odd global data line GIOo in dependence on the operation of the switch 118.

A case where the inner row block 113 not placed at an edge of the cell array 110a is selected by the row decoder 120 will be described. In this case, a word line WL of the row block 113 is activated. Some of the bit lines (dashed lines) formed in the row block 113 are connected to the bit line sense amplifiers 112a to provide data thereto. Some of the bit lines BL (solid lines) of formed in the row block 113 are connected to the bit line sense amplifiers 114a to provide data thereto. Data is sensed from the memory cells connected to the activated word line in selected row block 113 by both the bit line sense amplifiers 112a and the bit line sense amplifiers 114a. The sensed data are output to the local sense amplifier 112b and the local sense amplifier 114b from bit line sense amplifiers 112a and 114a respectively. Data latched by bit line sense amplifiers 112a and 114a may be output sequentially, such as word by word (e.g., in groups of 64, 32, 16 or 8 bits) based on sequential selection of different sub-groups of bit line sense amplifiers 112a and 114a in response to different column select signals CSL being activated. The local sense amplifier 112b outputs data to the odd global data line GIOo, and the local sense amplifier 114b outputs data to the even global data line GIOe. That is, data of a row block that is not placed at an edge of the cell array 110a may be provided to the even global data line GIOe or the odd global data line GIOo to which a local sense amplifier is physically connected.

In contrast, the edge row blocks 111 and 117 placed at edges of the cell array 110a are selected by the row decoder 120 when a row address identifying a word line in one or both of the row blocks 111 and 117 is input to row decoder 120. In this example, a row address input to row decoder 120 results in a word line WL in each of the row blocks 111 and 117 being activated. The bit lines BL formed in the edge row block 111 are connected to the bit line sense amplifiers 112a. Also, bit lines BL formed in the edge row block 117 are connected to the bit line sense amplifiers 116a. In this case, data stored the row of memory cells connected to the activated word line in the selected edge row block 111 are sensed by the bit line sense amplifiers 112a, and the sensed data are provided to the local sense amplifier 112b through the local data lines LIO. The local sense amplifier 112b may output the data of the edge row block 111 to the odd global data line GIOo. In this case, the data of the edge row block 111 is provided to the input/output sense amplifier 150 through the odd global data line GIOo.

In addition, data stored in the row of memory cells connected to the activated word line of the selected edge row block 117 are sensed by the bit line sense amplifiers 116a, and the sensed data are provided to the local sense amplifier 116b through the local data lines LIO. Here, if the data output from the local sense amplifier 116b were to be provided to the odd global data line GIOo, collision with the data output from the local sense amplifier 112b would occur. Accordingly, the switch 118 may be controlled such that data sensed from the edge row block 117 are provided to the even global data line GIOe. The switch 118 may provide the data of the edge row block 117 to the even global data line GIOe in response to the select signal SEL. Thus, data of edge row block 111 and edge row block 117 may be simultaneously output on global data lines GIOo and GIOe. In addition, such data output simultaneously on global data lines GIOo and GIOe may correspond to memory cells identified by a single row address which may cause concurrent activation by row decoder 120 of word lines in edge row block 111 and edge row block 117.

The switch 118 may electrically connect the local sense amplifier 116b with the even global data line GIOe upon selecting the edge row block 117. In contrast, the switch 118 may electrically connect the local sense amplifier 116b with the odd global data line GIOo upon selection of the inner row blocks, such as any selection of a row block other than the edge row blocks 111 and 117. Even though the even number of row blocks are formed, data collision on the global data line GIO is avoided by the switch 118. Here, the select signal SEL for controlling the switch 118 may be generated in response to a row address and/or by detecting activation of a row block placed at an edge of the cell array 110a.

Figure 4A:
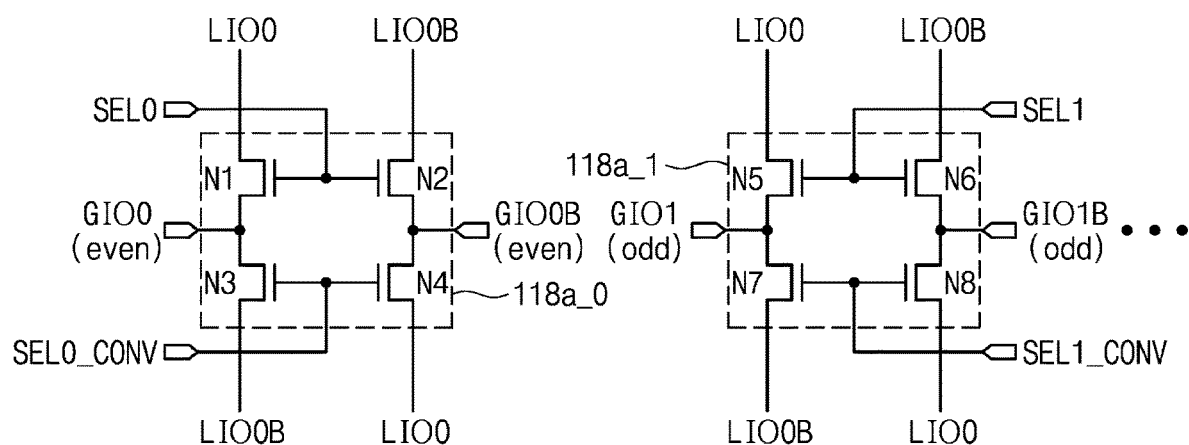
FIGS. 4A and 4B are circuit diagrams illustrating an example of a switch of FIG. 3.
Figure 4B:
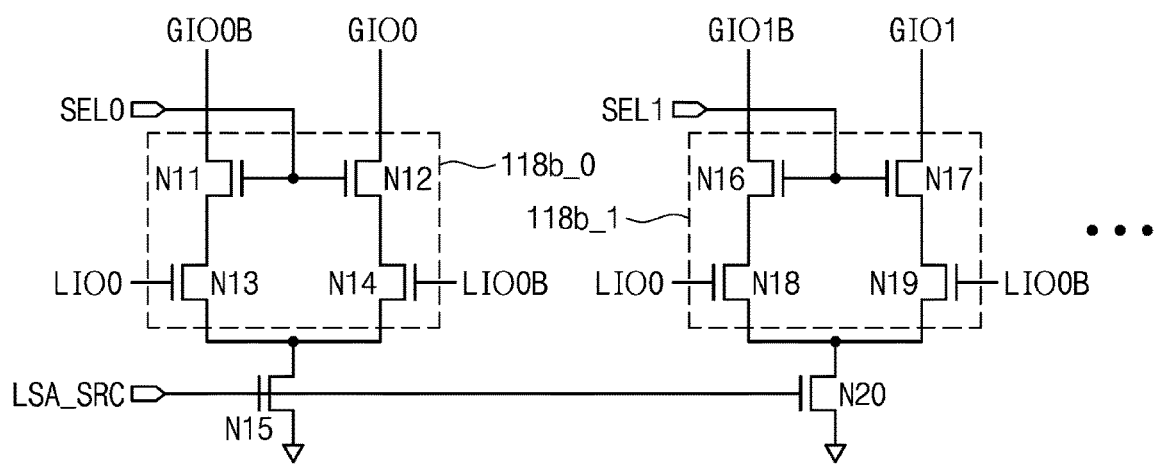

FIGS. 4A and 4B are circuit diagrams illustrating an exemplary structure of switch 118 of FIG. 3. The switches of FIGS. 4A and 4B may be used for both reading and writing of data to the memory array 110 However, in some implementations, the switch 118a of FIG. 4A may be used for writing data in an edge row block, and used together with the switch 118b FIG. 4B for reading data from an edge row block.

Referring to FIG. 4A, the switch 118a may include an even switch 118a_0 and an odd switch 118a_1. The even switch 118a_0 provides data of an even global data line pair GIO0/GIO0B (e.g., provided as a differential signal) corresponding to one even global data line GIOe of a set of global data lines GIOe to the local sense amplifier (LSA) 116b in response to even select signals SEL0 and SEL0_CONV. The switch 118a may further include even switches 118a_2, 118a_4, etc. for connecting even global data line pairs GIO2/GIO2B, GIO4/GIO4B, etc. (corresponding to other global data lines GIOe of the set of global data lines GIOe in FIG. 3) to the local sense amplifier 116b in addition to the even switch 118a_0. However, only one even switch 118a_0 is illustrated in FIG. 4A for convenience of description.

One of the even select signals SEL0 and SEL0_CONV may be activated when the selected word line is in edge row block 117. Which of SEL0 or SEL0_CONV is activated may depend on whether a selected memory cell should have a complementary value stored therein. If the even select signal SEL0 is activated and the even select signal SEL0_CONV is deactivated, NMOS transistors N1 and N2 are turned on, and NMOS transistors N3 and N4 are turned off. In this case, data provided from the global data line pair GIO0/GIO0B are transferred to a local data line pair LIO0/LIO0B. In contrast, if the even select signal SEL0 is deactivated and the even select signal SEL0_CONV is activated, the NMOS transistors N1 and N2 are turned off, and the NMOS transistors N3 and N4 are turned on. In this case, data provided to the global data line pair GIO0/GIO0B are inverted and transferred to the local data line pair LIO0/LIO0B. The local data line pair LIO0/LIO0B may be connected to local sense amplifier LSA3 to connect (e.g., selectively connect) to one of the local I/O lines LIO and a corresponding bit line sense amplifier 116a of bit line sense amplifier block BLSA_BLK3. Each of the local I/O lines LIO may be a pair of lines to provide data between the bit line sense amplifiers BLSA and the local sense amplifiers LSA (e.g., 112b, 114b, 116b) in the form of differential signals. Alternatively, local sense amplifiers LSA (e.g., 112b, 114b, 116b) may convert the differential signals from the global IO lines GIOe and GIOo to single ended signals.

The odd switch 118a_1 provides data of an odd global data line pair GIO1/GIO1B (i.e., provided as a differential signal) to the local sense amplifier (LSA) 116b in response to odd select signals SEL1 and SEL1_CONV. The switch 118a may further include odd switches 118a_3, 118a_5, etc. for connecting odd global data line pairs GIO3/GIO3B, GIO5/GIO5B, etc. to the local sense amplifier 116b in addition to the odd switch 118a_1. However, only one odd switch 118a_1 is illustrated in FIG. 4A for convenience of description. Each of these global data line pairs may correspond to an odd global data line of the global data line set GIOo in FIG. 3. One of the odd select signals SEL1 and SEL1_CONV may be activated when the activated word line is not part of edge row block 117 (e.g., when the activated word line is part of row block 115). Which odd select signal SEL1 or SEL1_CONV is activated may depend on whether a selected memory cell should have a complementary value stored therein.

If the odd select signal SEL1 is activated and the odd select signal SEL1_CONV is deactivated, NMOS transistors N5 and N6 are turned on such that data provided from the global data line pair GIO1/GIO1B are transferred to a local data line pair LIO1/LIO1B, and NMOS transistors N7 and N8 are turned off. In contrast, if the odd select signal SEL1_CONV is activated, the NMOS transistors N5 and N6 are turned off, and the NMOS transistors N7 and N8 are turned on. In this case, data provided to the global data line pair GIO1/GIO1B are inverted and transferred to the local data line pair LIO1/LIO1B.

In the case where an edge row block is selected in a data write operation, to connect the local sense amplifier 116b to the even global data line GIOe, one of each pair of even select signals SEL0/SEL0_CONV, SEL2/SEL2_CONV, SEL4/SEL4_CONV, etc. are activated, and odd select signals SEL1/SEL1_CONV, SEL3/SEL3_CONV, SEL5/SEL5_CONV, etc. are deactivated. In this case, odd switches 118a_1, 118a_3, 118a_5, etc. are turned off, and thus, the odd global data line pairs GIO1/GIO1B, GIO3/GIO3B, GIO5/GIO5B, etc. and the local sense amplifier 116b are electrically disconnected. In contrast, even switches 118a_0, 118a_2, 118a_4, etc. are turned on, and thus, the even global data line pairs GIO0/GIO0B, GIO2/GIO2B, GIO4/GIO4B, etc. and the local sense amplifier 116b are electrically connected to each other and may pass data signals therebetween.

Referring to FIG. 4B, the switch 118b may include an even switch 118b_0 and an odd switch 118b_1. In a read operation, NMOS transistors N15 and N20 are turned on if a local enable signal LSA_SRC is activated, and thus, the switch 118b is activated. In the read operation, it is sufficient to provide data from the local sense amplifier 116b to the global data line GIOe/GIOo. Accordingly, it is no need for separation of select signals depending on a bit line location like a write operation.

The even switch 118b_0 inverts data of the local data line pair LIO0/LIO0B of the local sense amplifier (LSA) 116b in response to a select signal SEL0 and transfers the inverted data to the global data line pair GIO0/GIO0B. The switch 118b may further include even switches 118b_2, 118b_4, 118b_6, etc. for transferring inverted versions of data of the local data line pairs LIO2/LIO2B, LIO4/LIO4B, LIO0/LIO0B, etc. to the even global data line pairs GIO2/GIO2B, GIO4/GIO4B, GIO6/GIO6B, etc. in addition to the even switch 118b_0. However, only one even switch 118b_0 is illustrated in FIG. 4B for convenience of description.

If an edge row block (e.g., 117) is selected, the local enable signal LSA_SRC and the even select signal SEL0 may be activated, and an odd select signal SEL1 may be deactivated. In this case, NMOS transistors N11 and N12 of the even switch 118b_0 are turned on, and NMOS transistors N16 and N17 of an odd switch 118b_1 are turned off. Accordingly, the local data line pair LIO0/LIO0B and the odd global data line pair GIO1/GIO1B are electrically separated. However, since the NMOS transistors N11 and N12 are turned on, NMOS transistors N13 and N14 are switched according to a data value of the local data line pair LIO0/LIO0B. As such, the data value of the local data line pair LIO0/LIO0B is inverted and transferred to the even global data line pair GIO0/GIO0B.

In contrast, if a row block (e.g., 115) not placed at an edge of the cell array 110b is selected, the local enable signal LSA_SRC and the odd select signals SEL1, SEL3, SEL5, etc. may be activated, and even select signals SEL0, SEL2, SEL4, etc. may be deactivated. In this case, the NMOS transistors N11 and N12 of the even switch 118b_0 are turned off, and the NMOS transistors N16 and N17 of the odd switch 118b_1 are turned on. Accordingly, the local data line pair LIO0/LIO0B and the even global data line pair GIO0/GIO0B are electrically separated. However, since the NMOS transistors N16 and N17 are turned on, the NMOS transistors N18 and N19 are switched according to a data value of the local data line pair LIO0/LIO0B. As such, a data value of the local data line pair LIO0/LIO0B is inverted and transferred to the odd global data line pair GIO1/GIO1B.

In the case where an edge row block is selected in a data read operation, to connect the local sense amplifier 116b to the even global data line GIOe, even select signals SEL0, SEL2, SEL4, etc. are activated, and odd select signals SEL1, SEL3, SEL5, etc. are deactivated. In this case, the odd switches 118b_1, 118b_3, 118b_5, etc. are turned off, and thus, the odd global data line pairs GIO1/GIO1B, GIO3/GIO3B, GIO5/GIO5B, etc. and the local sense amplifier 116b are electrically separated from each other. In contrast, the even switches 118b_0, 118b_2, 118b_4, etc. are turned on, and thus, the even global data line pairs GIO0/GIO0B, GIO2/GIO2B, GIO4/GIO4B, etc. and the local sense amplifier 116b are electrically connected to each other.

Figure 5A:
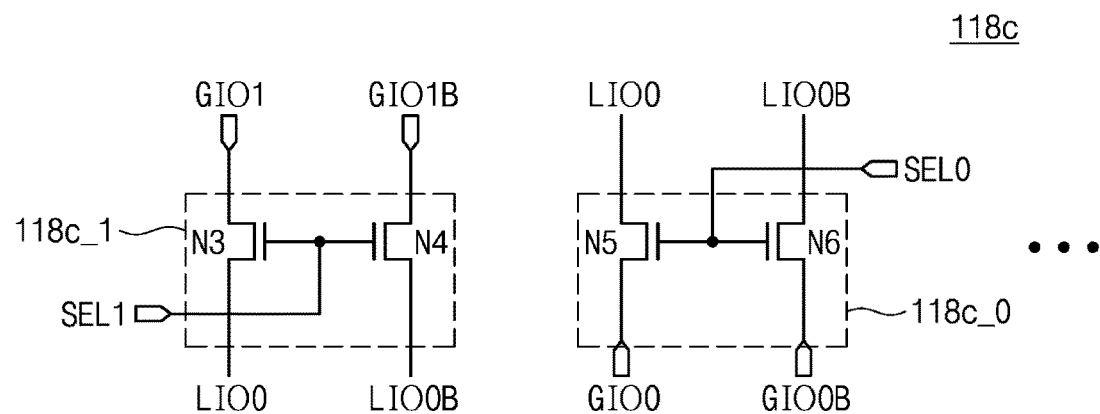
FIGS. 5A and 5B are circuit diagrams illustrating another example of a switch of FIG. 3.
Figure 5B:
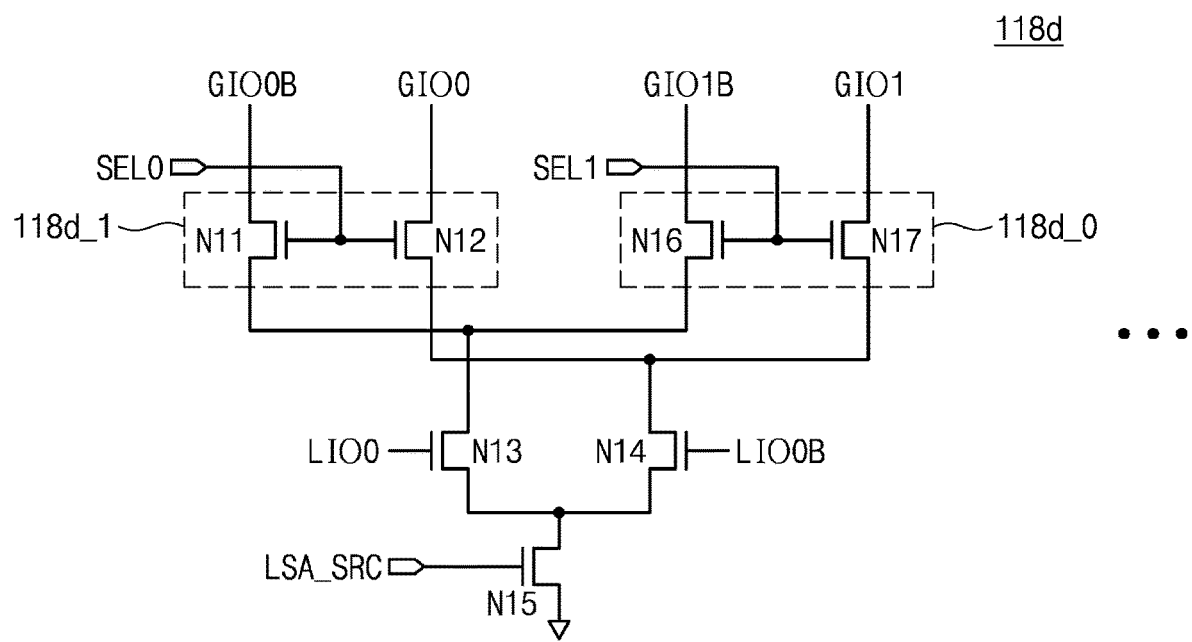

FIGS. 5A and 5B are circuit diagrams illustrating another example of a switch of FIG. 3. FIG. 5A shows a structure of a switch 118c for writing data in an edge row block, and FIG. 5B shows a structure of a switch 118d for reading data from an edge row block. FIGS. 5A and 5B show simplified circuits of structures of FIGS. 4A and 4B.

Referring to FIG. 5A, the switch 118c may include an even switch 118c_0 and an odd switch 118c_1. The even switch 118c_0 provides data of an even global data line pair GIO0/GIO0B corresponding to one even global data line GIOe to the local sense amplifier (LSA) 116b in response to an even select signal SEL0. The even switch 118c_0 may further include even switches 118c_2, 118c_4, etc. for connecting even global data line pairs GIO2/GIO2B, GIO4/GIO4B, etc. to the local sense amplifier 116b in addition to the even switch 118c_0. However, only one even switch 118c_0 is illustrated in FIG. 5A for convenience of description.

The odd switch 118c_1 provides data of an odd global data line pair GIO1/GIO1B to the local sense amplifier (LSA) 116b in response to an odd select signal SEL1 The switch 118c may further include odd switches 118c_3, 118c_5, etc. for connecting odd global data line pairs GIO3/GIO3B, GIO5/GIO5B, etc. to the local sense amplifier 116b in addition to the odd switch 118c_1. However, only one odd switch 118c_1 is illustrated in FIG. 5A for convenience of description.

If the odd select signal SEL1 is activated and the even select signal SEL0 is deactivated, the NMOS transistors N3 and N4 are turned on, and the NMOS transistors N5 and N6 are turned off. In this case, data provided from the odd global data line pair GIO1/GIO1B are transferred to the local data line pair LIO0/LIO0B. In contrast, if the odd select signal SEL1 is deactivated and the even select signal SEL0 is activated, the NMOS transistors N3 and N4 are turned off, and the NMOS transistors N5 and N6 are turned on. In this case, data provided from the even global data line pair GIO0/GIO0B are transferred to the local data line pair LIO0/LIO0B.

In the case where an edge row block is selected in a data write operation, to connect the local sense amplifier 116b to the even global data line GIOe, even select signals SEL0, SEL2, SEL4, etc. are activated, and odd select signals SEL1, SEL3, SEL5, etc. are deactivated. In this case, the odd switches 118c_1, 118c_3, 118c_5, etc. are turned off, and thus, the odd global data line pairs GIO1/GIO1B, GIO3/GIO3B, GIO5/GIO5B, etc. and the local sense amplifier 116b are electrically separated from each other. In contrast, even switches 118c_0, 118c_2, 118c_4, etc. are turned on, and thus, the even global data line pairs GIO0/GIO0B, GIO2/GIO2B, GIO4/GIO4B, etc. and the local sense amplifier 116b may be electrically connected to each other.

Referring to FIG. 5B, the switch 118d may include an even switch 118d_0 and an odd switch 118d_1. In a read operation, the NMOS transistor N15 is turned on if the local enable signal LSA_SRC is activated, and thus, the switch 118d is activated.

The even switch 118d_0 inverts data of the local data line pair LIO0/LIO0B of the local sense amplifier (LSA) 116b in response to the select signal SEL0 and transfers the inverted data to the even global data line pair GIO0/GIO0B. The switch 118d may further include even switches 118d_2, 118d_4, 118d_6, etc. for transferring inverted versions of data of the local data line pairs LIO2/LIO2B, LIO4/LIO4B, LIO0/LIO0B, etc. to the even global data line pairs GIO2/GIO2B, GIO4/GIO4B, GIO6/GIO6B, etc. in addition to the even switch 118d_0. However, only one even switch 118d_0 is illustrated in FIG. 5B for convenience of description.

If an edge row block (e.g., 117) is selected, the local enable signal LSA_SRC and the even select signal SEL0 may be activated, and the odd select signal SEL1 may be deactivated. In this case, the NMOS transistors N11 and N12 of the even switch 118d_0 are turned on, and the NMOS transistors N16 and N17 of an odd switch 118d_1 are turned off. Accordingly, the local data line pair LIO0/LIO0B and the odd global data line pair GIO1/GIO1B are electrically separated. However, since the NMOS transistors N11 and N12 are turned on, the NMOS transistors N13 and N14 are switched according to a data value of the local data line pair LIO0/LIO0B. As such, the data value of the local data line pair LIO0/LIO0B is inverted and transferred to the even global data line pair GIO0/GIO0B.

In contrast, if a row block (e.g., 115) not placed at an edge of the cell array 110b is selected, the local enable signal LSA_SRC and the odd select signals SEL1, SEL3, SEL5, etc. may be activated, and the even select signals SEL0, SEL2, SEL4, etc. may be deactivated. In this case, the NMOS transistors N11 and N12 of the even switch 118d_0 are turned off, and the NMOS transistors N16 and N17 of the odd switch 118d_1 are turned on. Accordingly, the local data line pair LIO0/LIO0B and the odd global data line pair GIO0/GIO0B are electrically separated. However, since the NMOS transistors N16 and N17 are turned on, the NMOS transistors N18 and N19 are switched according to a data value of the local data line pair LIO0/LIO0B. As such, a data value of the local data line pair LIO0/LIO0B is inverted and transferred to the odd global data line pair GIO1/GIO1B.

In the case where an edge row block is selected in a data read operation, to connect the local sense amplifier 116b to the even global data line GIOe, the even select signals SEL0, SEL2, SEL4, etc. are activated, and the odd select signals SEL1, SEL3, SEL5, etc. are deactivated. In this case, the odd switches 118d_1, 118d_3, 118d_5, etc. are turned off, and thus, the odd global data line pairs GIO1/GIO1B, GIO3/GIO3B, GIO5/GIO5B, etc. and the local sense amplifier 116b are electrically separated from each other. In contrast, the even switches 118d_0, 118d_2, 118d_4, etc. are turned on, and thus, the even global data line pairs GIO0/GIO0B, GIO2/GIO2B, GIO4/GIO4B, etc. and the local sense amplifier 116b are electrically connected to each other.

Figure 6:
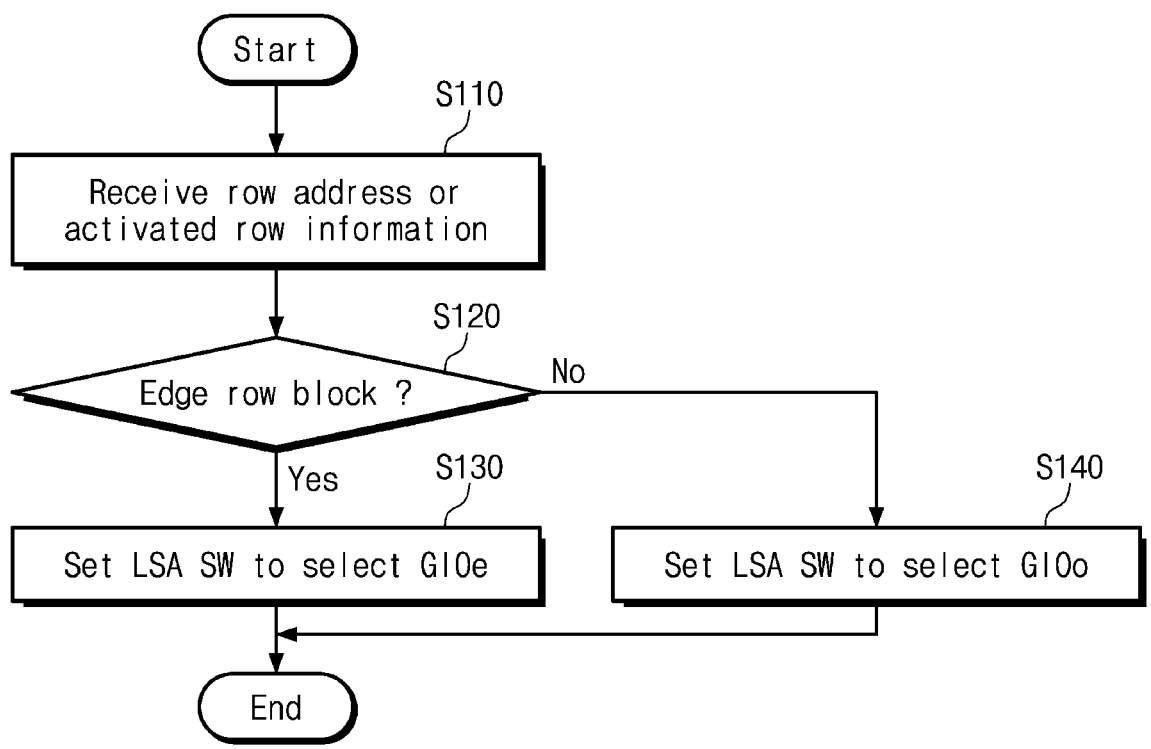
FIG. 6 is a flowchart illustrating a method of selecting a global data line, according to an embodiment of the inventive concept.

Various examples of the switch 118 are above described with reference to FIGS. 4A, 4B, 5A, and 5B. However, the configurations or functions of the switch 118 are not limited to the above-described examples. It may be well understood that there is variously changed a configuration of the switch 118 for selecting the global data lines GIOe and GIOo when the edge row block 117 is selected. It will be appreciated that the various select signals described with respect to FIGS. 4A, 4B, 5A, and 5B are generically represented in FIG. 3 as select signal SEL and may be generated by row decoder 120 decoding a row address, and more particularly, in response to whether or not the row address identifies a word line to be activated in edge row block 117. FIG. 6 is a flowchart illustrating a method of selecting a global data line, according to an embodiment of the inventive concept. Referring to FIG. 6, the switch 118 of the inventive concept may change a data path between a local sense amplifier LSA and the global data line GIOe/GIOo upon selecting an edge row block and upon selecting a non-edge row block.

In operation S110, a row address may be received by the row decoder 120. Alternatively, information of a row block to be activated by the row address may be provided to the switch 118.

In operation S120, whether the row block to be activated by the row address is an edge row block or a non-edge row block is determined. If it is determined that the row block to be activated is a non-edge row block (No), the procedure proceeds to operation S140. In contrast, if it is determined that the row block to be activated is an edge row block (Yes), the procedure proceeds to operation S130. In some examples, operation S120 may determine if a row address corresponds to a word line to be activate in a particular row block, such as one of the edge row blocks of a memory array.

In operation S130, the switch 118 connects the local sense amplifier 116b and the even global data line GIOe. In the case where a word line targeted for a read operation is activated, the switch 118 may transfer data sensed from memory cells of the edge row block 117 and latched by the local sense amplifier 116b to the even global data line GIOe. In the case where a word line targeted for a write operation is activated, the even global data line GIOe and the local sense amplifier 116b may be connected by the switch 118 such that write data input to the even global data line GIOe are provided to the local sense amplifier 116b.

In operation S140, the switch 118 connects the local sense amplifier 116b and the odd global data line GIOo. In a read operation, data sensed from memory cells of the edge row block 117 and latched by the local sense amplifier 116b may be provided to the odd global data line GIOo through the switch 118. In a write operation, the odd global data line GIOo and the local sense amplifier 116b may be connected by the switch 118 such that write data input to the odd global data line GIOo are provided to the local sense amplifier 116b.

A data path selection method in which the even global data line GIOe or the odd global data line GIOo is selected according to whether an input row address is an address for selecting an edge row block or an address for selecting a non-edge row block is described above.

Figure 7:
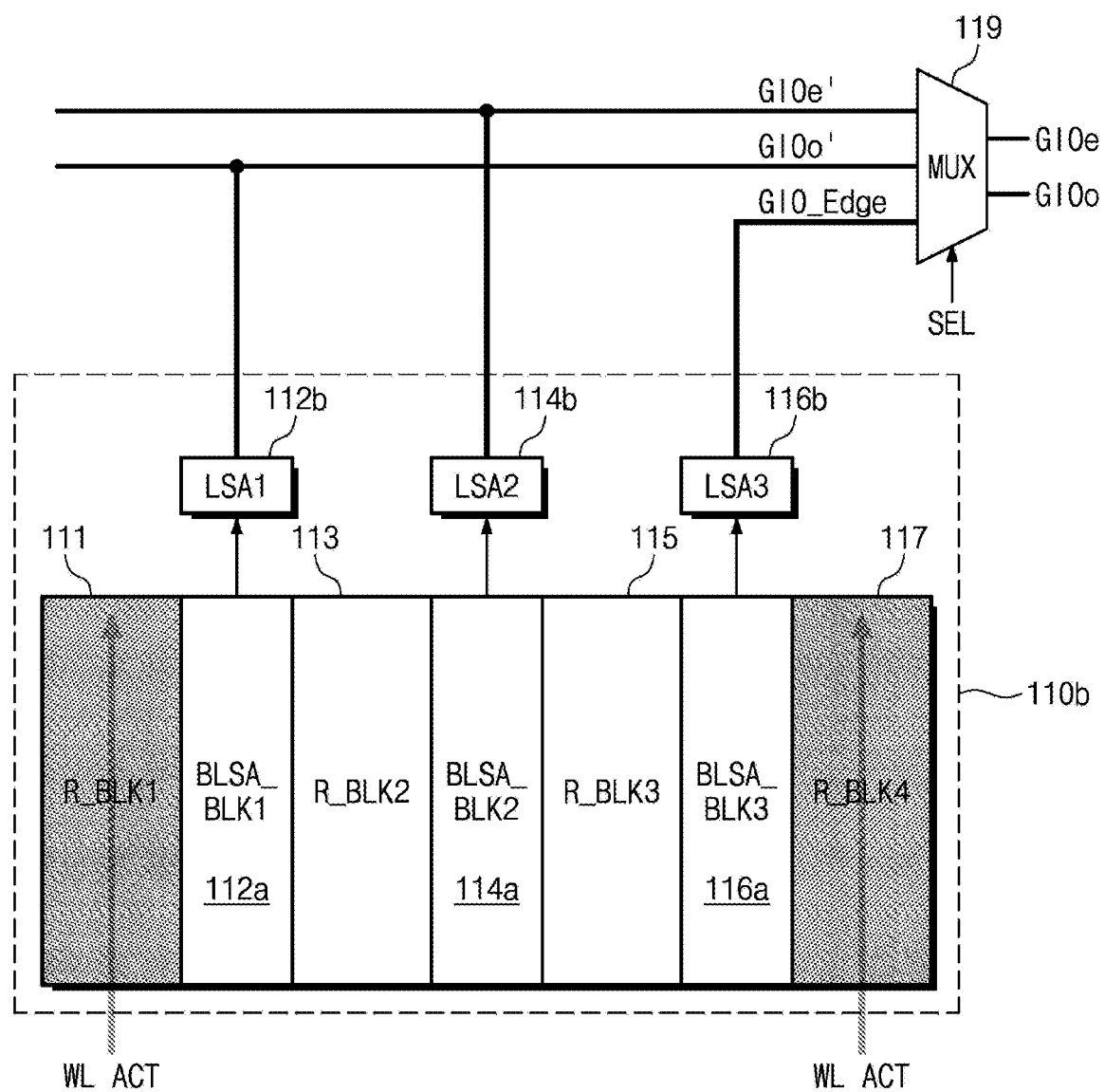
FIG. 7 is a block diagram illustrating a configuration of a data path according to another embodiment of the inventive concept.

FIG. 7 is a block diagram illustrating a configuration of a data path according to another embodiment of the inventive concept. Referring to FIG. 7, a cell array 110b includes the local sense amplifier 116b that outputs data to an edge global data line GIO_Edge. The DRAM device 100 further includes a multiplexer 119 that connects the edge global data line GIO_Edge to the even global data line GIOe or the odd global data line GIOo depending on a select signal SEL. Select signal SEL may be generated in response to the row address received by the row decoder 120, such as being a result of decoding all or part of the row address by row decoder 120.

If the non-edge row block 115 is selected by the row decoder 120 (refer to FIG. 1), a word line of the non-edge row block 115 is activated. Data stored in the selected non-edge row block 115 are sensed by the bit line sense amplifiers 114a and the bit line sense amplifiers 116a. The sensed data are output to the local sense amplifier 114b and the local sense amplifier 116b. The local sense amplifier 114b may output data to an even global data line GIOe', and the local sense amplifier 116b may output data to an odd global data line GIOo'. In this case, the multiplexer 119 may output data of the even global data line GIOe' to the even global data line GIOe of an output side and may output data of the odd global data line GIOo' to the odd global data line GIOe of an output side.

In contrast, if the edge row blocks 111 and 117 are selected by the row decoder 120, data of the edge row block 111 may be provided to the odd global data line GIOo' through the local sense amplifier 112b. In contrast, data of the edge row block 117 may be provided to the edge global data line GIO_Edge through the local sense amplifier 116b. In this case, depending on the select signal SEL, the multiplexer 119 may connect the odd global data line GIOo' connected to the local sense amplifier 112b to the odd global data line GIOo and may connect the edge global data line GIO_Edge connected to the local sense amplifier 116b to the even global data line GIOe.

The additional edge global data line GIO_Edge for providing a data path of the edge row block 117 is formed in the cell array 110 of the inventive concept, and a data path may be adjusted by the multiplexer 119 formed in a peripheral circuit area. Accordingly, in the case where it is difficult to add a circuit in the cell array 110, a data path may be switched through the multiplexer 119 formed in the peripheral circuit area.

Figure 8:
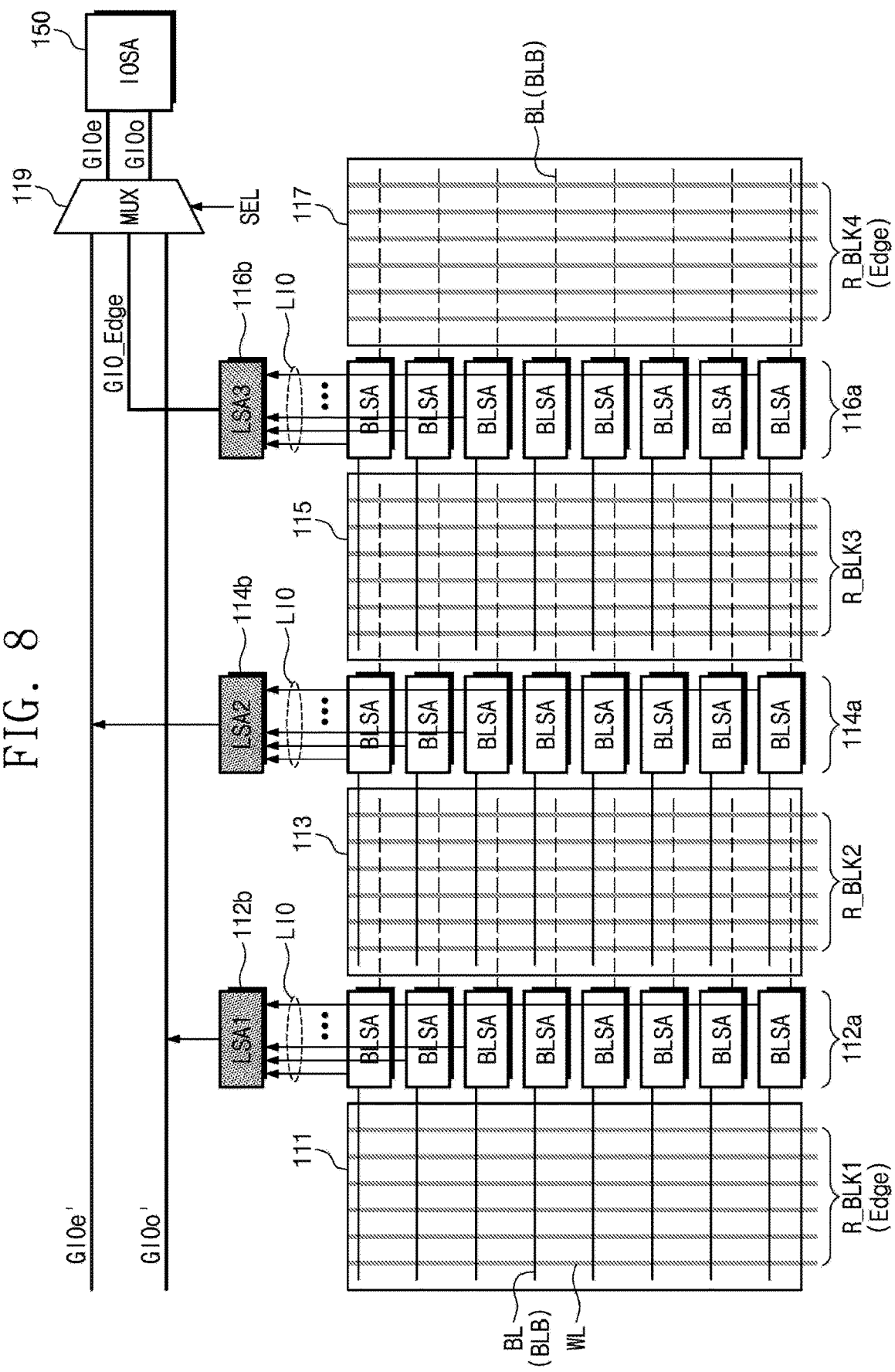
FIG. 8 is a block diagram illustrating a detailed structure of a cell array of FIG. 7.

FIG. 8 is a block diagram illustrating a detailed structure of a cell array of FIG. 7. Referring to FIG. 8, the multiplexer 119 that connects the edge global data line GIO_Edge to the even global data line GIOe or the odd global data line GIOo depending on the select signal SEL is provided on an input side of the input/output sense amplifier 150.

Each of the row blocks 111, 113, 115, and 117 may include a plurality of memory cells at intersections of a plurality of word lines WL and a plurality of bit line BL and BLB. Four row blocks 111, 113, 115, and 117 are illustrated to describe the case where the even number of row blocks are provided. However, the inventive concept may not be limited thereto. That is, there may be provided row blocks 111, 113, 115, and 117, the number of which is an even number of 2 or more. The row blocks 111, 113, 115, and 117 and the bit line sense amplifiers 112a, 114a, and 116a are substantially the same as those of FIG. 3. Accordingly, configurations or functions of the row blocks 111, 113, 115, and 117 and the bit line sense amplifiers 112a, 114a, and 116a will not be repeated here.

If the non-edge row block 113 (e.g., an inner row block that is not placed at an edge of the cell array 110) is selected by the row decoder 120, a word line WL of the non-edge row block 113 may be activated. Some of the bit lines BL formed in the non-edge row block 113 (dashed lines) are connected to the bit line sense amplifiers 112a. Some of the bit lines BL in the non-edge row block (R_BLK2) 113 (solid lines) are connected to the bit line sense amplifiers 114a. Data stored in a row of memory cells connected to the activated word line in the selected non-edge row block 113 are sensed by the bit line sense amplifiers 112a and the bit line sense amplifiers 114a. The sensed data are output to the local sense amplifier 112b and the local sense amplifier 114b. The local sense amplifier 112b outputs data to the odd global data line GIOo', and the local sense amplifier 114b outputs data to the even global data line GIOe'. In this case, the multiplexer 119 may connect the odd global data line GIOo' and the even global data line GIOe' to the odd global data line GIOo and the even global data line GIOe connected to the input/output sense amplifier 150.

In contrast, the edge row blocks 111 and 117 placed at edges of the cell array 110 may be selected by the row decoder 120. In this case, word lines WL in each of the edge row blocks 111 and 117 may be activated. Bit lines BL formed in the edge row block 111 are connected to the bit line sense amplifiers 112a. Also, bit lines formed in the edge row block 117 are connected to the bit line sense amplifiers 116a. In this case, data of memory cells connected to the activated word line in the selected edge row block 111 are sensed by the bit line sense amplifiers 112a, and the sensed data are provided to the local sense amplifier 112b through the local data lines LIO. The local sense amplifier 112b outputs the data to the odd global data line GIOo'. In addition, data of the memory cells connected to the word line activated in the selected edge row block 117 are sensed by a part of the bit line sense amplifiers 116a, and the sensed data are provided to the local sense amplifier 116b through the local data lines LIO. The local sense amplifier 116b outputs the data of the selected edge row block 117 to the edge global data line GIO_Edge. In this case, the multiplexer 119 may connect the edge global data line GIO_Edge and the even global data line GIOe. Accordingly, pieces of data of the edge row blocks 111 and 117 are provided at the same time to the input/output sense amplifier 150 without collision.

Figure 9:
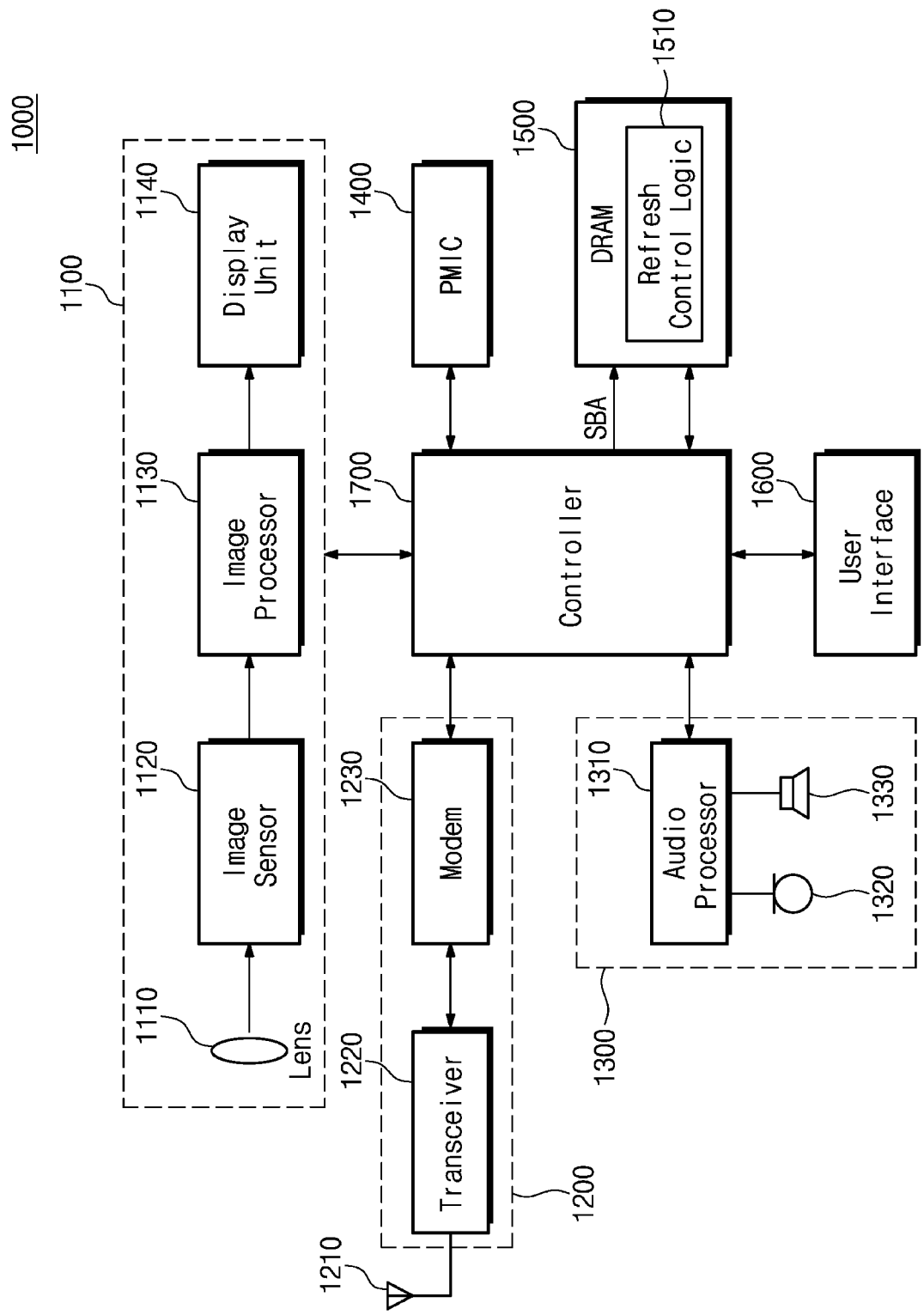
FIG. 9 is a block diagram illustrating a portable terminal including a semiconductor memory device according to an embodiment of the inventive concept.

FIG. 9 is a block diagram illustrating a portable terminal according to an embodiment of the inventive concept. Referring to FIG. 9, a portable terminal 1000 according to an embodiment of the inventive concept includes an image processing unit 1100, a wireless transceiver unit 1200, an audio processing unit 1300, a PMIC 1400, a DRAM 1500, a user interface 1600, and a controller 1700.

The image processing unit 1100 may include a lens 1110, an image sensor 1120, an image processor 1130, and a display unit 1140. The wireless transceiver unit 1200 includes an antenna 1210, a transceiver 1220, and a modulator/demodulator (modem) 1230. The audio processing unit 1300 includes an audio processor 1310, a microphone 1320, and a speaker 1330. Here, a DRAM 1500 may be used as a working memory of the portable terminal 1000. In addition, the DRAM 1500 may be used as a buffer memory of the portable terminal 1000. The user interface 1600 may be a component for receiving a user input signal.

Here, the DRAM 1500 may be that described with respect to other embodiments and may include a bit line sense amplifier BLSA of an open bit line structure. Also, the DRAM 1500 may include the switch 118 of FIG. 2 and/or the multiplexer 119 of FIG. 7 such that data of an edge row block are not collided even though the even number of row blocks are provided.

Figure 10:
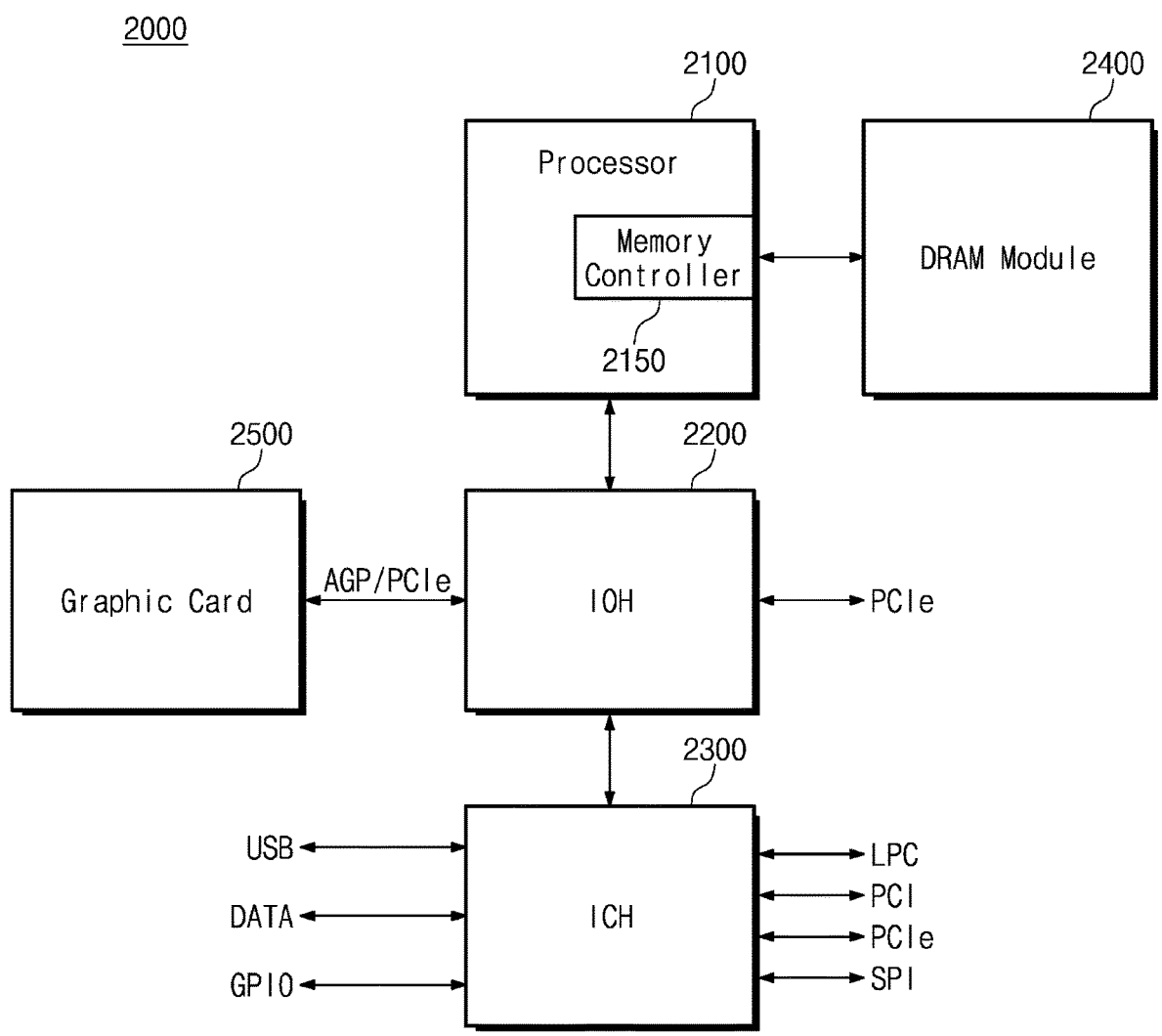
FIG. 10 is a block diagram illustrating a computing system including a semiconductor memory device according to an embodiment of the inventive concept.

FIG. 10 is a block diagram illustrating a computing system according to an embodiment of the inventive concept. Referring to FIG. 10, a computing system 2000 includes a processor 2100, an input/output hub 2200, an input/output controller hub 2300, at least one DRAM module 2400, and a graphic card 2500. Here, the computing system 2000 may be any one of a personal computer (PC), a server computer, a workstation, a laptop, a mobile phone, a smartphone, personal digital assistant (PDA), a portable multimedia player (PMP), a digital camera, a digital television (TV), a set-top box, a music player, a portable game console, and a navigation system.

The processor 2100 may execute various computing functions such as specific calculations or tasks. For example, the processor 2100 may be a microprocessor or a central processing unit (CPU). The processor 2100 may include a single processor core or may include a plurality of processor cores (or a multi-core). For example, the processor 2100 may include a multi-core such as a dual-core, a quad-core, a hexa-core, or the like. Also, the computing system 2000 including one processor 2100 is illustrated in FIG. 10, but the computing system 2000 may include a plurality of processors. Also, the processor 2100 may further include a cache memory that is placed inside or outside the processor 2100.

The processor 2100 may include a memory controller 2150 that controls an operation of the DRAM module 2400. The memory controller 2150 included in the processor 2100 is called an "integrated circuit memory controller (IMC)". A memory interface between the memory controller 2150 and the DRAM module 2400 may be implemented with one channel including a plurality of signal lines or with a plurality of channels. Also, one or more DRAM modules may be connected with each channel. The memory controller 2150 may be placed within the input/output hub 2200. The input/output hub 2200 including the memory controller 2150 may be called a "memory controller hub (MCH)".

The DRAM module 2400 may include a plurality of DRAM devices that store data provided from the memory controller 2150. Each of the DRAM devices may be implemented with the DRAM devices as described with respect to other embodiments, such as 100 of FIG. 1.

The input/output hub 2200 may manage data transmission between the processor 2100 and devices such as the graphic card 2500. The input/output hub 2200 may be connected to the processor 2100 through interfaces of various manners. For example, the input/output hub 2200 and the processor 2100 may be connected through various standards of interfaces such as a front side bus (FSB), a system bus, hyper transport, lightning data transport (LDT), quick path interconnect (QPI), a common system interface (CSI), and the like. The computing system 2000 including one input/output hub 2200 is illustrated in FIG. 10, but the computing system 2000 may include a plurality of input/output hubs.

The input/output hub 2200 may provide various interfaces with devices. For example, the input/output hub 2200 may provide an accelerated graphics port (AGP) interface, peripheral component interface-express (PCIe), a communications streaming architecture (CSA) interface, and the like.

The graphic card 2500 may be connected with the input/output hub 2200 through AGP or PCIe. The graphic card 2500 may control a display device (not illustrated) for displaying an image. The graphic card 2500 may include an internal processor for processing image data and an internal semiconductor memory device. According to an embodiment, the input/output hub 2200 may include the graphic card 2500 placed outside the input/output hub 2200 or may include a graphic card instead of the graphic card 2500. The graphic device included in the input/output hub 2200 may be called "integrated graphics". Also, the input/output hub 2200 including a memory controller and a graphic device may be called a "graphics and memory controller hub (GMCH)".

The input/output controller hub 2300 may perform data buffering and interface arbitration to allow various system interfaces to operate efficiently. The input/output controller hub 2300 may be connected with the input/output hub 2200 through an internal bus. For example, the input/output hub 2200 and the input/output controller hub 2300 may be connected through a direct media interface (DMI), a hub interface, an enterprise south-bridge interface (ESI), PCIe, and the like.

The input/output controller hub 2300 may provide various interfaces with peripheral devices. For example, the input/output controller hub 2300 may provide a universal serial bus (USB) port, a serial advanced technology attachment (SATA) port, a general purpose input/output (GPIO), a low pin count (LPC) bus, a serial peripheral interface (SPI), PCI, PCIe, and the like.

According to an embodiment, the processor 2100, the input/output hub 2200, and the input/output controller hub 2300 may be implemented with separate chipsets or integrated circuits, or two or more of the processor 2100, the input/output hub 2200, and the input/output controller hub 2300 may be implemented with one chipset.

According to an embodiment of the inventive concept, it may be possible to provide a semiconductor memory device having a data input/output structure in which data collision does not occur even though the even number of row blocks is provided. This may improve various designs a cell array of the semiconductor memory and a chip area may be efficiently used.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A semiconductor memory device comprising:
   a cell array including a first row block and a second row block;
   a bit line sense amplifier block configured to sense data stored in a selected one of the first row block and the second row block, the bit line sense amplifier block comprising a plurality of bit line sense amplifiers;
   a local sense amplifier configured to latch the sensed data transferred from the bit line sense amplifier block; and
   a switch configured to connect the local sense amplifier to a selected one of a first global data line and a second global data line in response to a select signal,
   wherein the second row block is located at a first edge of the cell array, and
   wherein the switch connects the local sense amplifier with the first global data line when the first row block is activated and connects the local sense amplifier with the second global data line when the second row block is activated.

2. The semiconductor memory device of claim 1, wherein each of the bit line sense amplifiers are connected to a corresponding bit line arranged in the first row block and a corresponding bit line arranged in the second row block.

3. The semiconductor memory device of claim 1, further comprising:
   a third row block that is activated simultaneously with the second row block;
   a second bit line sense amplifier block configured to sense second data stored in the third row block, the second bit line sense amplifier block comprising a plurality of second bit line sense amplifiers; and
   a second local sense amplifier configured to output the second data transferred from the second bit line sense amplifier block to the first global data line.

4. The semiconductor memory device of claim 3, wherein the third row block is located at a second edge of the cell array opposite to the first edge of the cell array.

5. The semiconductor memory device of claim 1, wherein the select signal is generated in response to activation of word line of the second row block such that the switch is connected with the local sense amplifier and the second global data line.

6. The semiconductor memory device of claim 1, further comprising:
a row decoder configured to generate the select signal in response to a received row address.

7. The semiconductor memory device of claim 1,
wherein the cell array is formed by a number of row blocks that are separated from each other by bit line sense amplifier blocks, and
wherein the number of row blocks is an even number.

8. The semiconductor memory device of claim 1, wherein each of the plurality of bit line sense amplifiers of the bit line sense amplifier block is connected to two bit lines to form an open bit line structure.

9. A semiconductor memory device which includes a first global data line and a second global data line, comprising:
a first edge row block forming one end of a cell array;
a second edge row block forming an opposite end of the cell array;
a first inner row block interposed between the first edge row block and the second edge row block;
a first local sense amplifier configured to output first data sensed from the first edge row block to the first global data line;
a second local sense amplifier configured to output second data sensed from the second edge row block to an edge global data line;
a third local sense amplifier configured to output third data sensed from the first inner row block to the second global data line; and
a multiplexer configured to selectively connect two of the first global data line, the second global data line, and the edge global data line with an input/output sense amplifier in response to a select signal.

10. The semiconductor memory device of claim 9, further comprising:
a row decoder configured to generate the select signal in response to a row address.

11. The semiconductor memory device of claim 9, wherein the multiplexer is configured to connect the first global data line and the second global data line with the input/output sense amplifier in response to a selection of the first inner row block.

12. The semiconductor memory device of claim 9, wherein the multiplexer is configured to connect the first global data line and the edge global data line with the input/output sense amplifier in response to the first edge row block or the second edge row block being selected.

13. The semiconductor memory device of claim 9, further comprising:
a row decoder configured to select the first edge row block and the second edge row block at the same time.

14. The semiconductor memory device of claim 9, further comprising:
a first bit line sense amplifier configured to sense the first edge row block and to provide a result sensed from the first edge row block as the first data to the first local sense amplifier; and
a second bit line sense amplifier configured to sense the second edge row block and to provide a result sensed from the second edge row block as the second data to the second local sense amplifier,
wherein the first bit line sense amplifier and the second bit line sense amplifier are each connected to two corresponding bit lines in an open bit line structure.

15. The semiconductor memory device of claim 9, wherein the multiplexer is formed in a peripheral area of the cell array.

16. A data path configuration method of a semiconductor memory device comprising:
receiving an address for selecting at least one of a plurality of row blocks included in a cell array;
determining whether the address corresponds to an edge row block among the plurality of row blocks of the cell array; and
connecting a local sense amplifier corresponding to the selected at least one row block to an even global data line or an odd global data line depending on the determination result.

17. The data path configuration method of claim 16,
wherein the edge row block corresponds to at least one of a first edge row block and a second edge row block placed at opposite sides of the cell array, and
wherein the first edge row block and the second edge row block are selected.

18. The data path configuration method of claim 17,
wherein connecting a local sense amplifier comprises connecting a first local sense amplifier having access to the first edge row block to the even global data line, and connecting a second local sense amplifier having access to the second edge row block to the odd global data line.

19. The data path configuration method of claim 16, wherein a bit line sense amplifier included in the cell array is connected to bit lines with an open bit line structure.

20. The data path configuration method of claim 16,
wherein the cell array is formed by a number of row blocks that are separated from each other by bit line sense amplifier blocks,
wherein the number of row blocks is an even number.

* * * * *